(12) United States Patent
Ferri et al.

(10) Patent No.: US 10,041,813 B2
(45) Date of Patent: Aug. 7, 2018

(54) POSITION SENSOR FOR A TIMEPIECE SETTING STEM

(71) Applicant: The Swatch Group Research and Development Ltd, Marin (CH)

(72) Inventors: Yvan Ferri, Lausanne (CH); Raphael Haenni, Sion (CH); Damien Schmutz, La Neuveville (CH); Pascal Lagorgette, Bienne (CH); Raphael Balmer, Courrendlin (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 15/516,752

(22) PCT Filed: Sep. 23, 2015

(86) PCT No.: PCT/EP2015/071907
§ 371 (c)(1),
(2) Date: Apr. 4, 2017

(87) PCT Pub. No.: WO2016/055275
PCT Pub. Date: Apr. 14, 2016

(65) Prior Publication Data
US 2017/0307414 A1 Oct. 26, 2017

(30) Foreign Application Priority Data
Oct. 7, 2014 (EP) ..................................... 14187867

(51) Int. Cl.
*G01D 5/241* (2006.01)
*G04C 3/00* (2006.01)
*H03K 17/975* (2006.01)

(52) U.S. Cl.
CPC ........... *G01D 5/2412* (2013.01); *G04C 3/007* (2013.01); *H03K 17/975* (2013.01)

(58) Field of Classification Search
CPC ....... G01D 5/2415; G01R 17/00; G01R 27/02
See application file for complete search history.

(56) References Cited

U.S. PATENT DOCUMENTS 6,339,336 B1   1/2002   Oisugi et al.
7,138,806 B2 * 11/2006   Gafner .............. A61M 5/31556
                                                    324/660

(Continued)

OTHER PUBLICATIONS

International Search Report dated May 17, 2016, in PCT/EP2015/071907, filed Sep. 23, 2015.

*Primary Examiner* — Giovanni Astacio-Oquendo
*Assistant Examiner* — Alvaro Fortich
(74) *Attorney, Agent, or Firm* — Oblon, McClelland, Maier & Neustadt, L.L.P (57) ABSTRACT

A capacitive sensor to determine instantaneous angular position of a rotatable element in a timepiece, such as a setting stem of a wristwatch. Static electrodes are configured to form, in conjunction with rotor electrodes of the rotatable element, a first differential capacitance pair and a second differential capacitance pair. A sensor calculation unit is configured to sense difference values from the differential capacitances pairs and to evaluate the angular position of the rotatable element from the difference values using predetermined information relating the differential capacitance values to angular position values.

12 Claims, 6 Drawing Sheets

(56) References Cited

U.S. PATENT DOCUMENTS

| | | | |
|---|---|---|---|
| 2008/0164869 A1* | 7/2008 | Bach | G01D 5/2053 |
| | | | 324/207.15 |
| 2010/0026137 A1* | 2/2010 | Murari | H02N 1/004 |
| | | | 310/300 |
| 2013/0127449 A1 | 5/2013 | Backes | |
| 2013/0271119 A1 | 10/2013 | Backes et al. | |

* cited by examiner

POSITION SENSOR FOR A TIMEPIECE SETTING STEM

TECHNICAL FIELD

The present invention relates to the field of sensing position and/or motion of a rotatable setting stem of a timepiece. More specifically, but not exclusively, the present invention relates to a capacitive sensor arrangement suitable for sensing the motion and/or position of a timepiece setting stem.

BACKGROUND OF THE INVENTION

In devices which combine mechanical moving parts and electronic control circuitry, such as electromechanical timepieces, there is a requirement for accurate sensors to sense the position and/or motion of rotating mechanical parts. For wristwatches having a rotatable setting stem, for example, an accurate and responsive sensor is required to detect the instantaneous angular position and/or rotation of the setting stem so that the watch-wearer's preferences can be converted quickly and accurately into electronic information which can be used by the watch's electronic control systems. Particularly in the field of wearable timepieces, it is important to maximise the accuracy and speed of such sensor, while minimising the power-consumption. In addition, the small-scale nature of components such as the setting stem of a wristwatch mean that rotation/motion sensors must be able to detect tiny movements of a tiny object, for example the rotation of a setting stem having a diameter of one millimeter or even less. The sensor components must also themselves be small, since space is limited. Such sensors should preferably be contactless in order to reduce wear and thereby extend the serviceable life of the timepiece. The sensor components should also be easy to manufacture.

PRIOR ART

A contactless sensor has been proposed in U.S. Pat. No. 6,252,825, which describes the use of a capacitive sensor for detecting positions and/or movements of a setting stem of a timepiece. The setting stem is provided with a rotor electrode which is shaped so as to modulate a capacitance between two stator electrodes. An embodiment is also described in which two such capacitances are arranged in quadrature in order to enable a sensor control system to deduce the direction of rotation of the setting stem.

SUMMARY OF THE INVENTION

It is an object of the present invention to provide a capacitive sensor for determining an instantaneous angular position, of a rotatable element of a timepiece, the capacitive sensor comprising a plurality of stator electrodes, and at least one rotor electrode arranged to rotate with the rotatable element, wherein the at least one rotor electrode and the stator electrodes are arranged to, during a rotation cycle of the rotatable element, provide capacitances between each of the plurality of stator electrodes, such that each of the capacitances varies over at least a portion of the said rotation cycle due to the influence of said one rotor electrode and, wherein: the at least one rotor electrode comprises a first rotor electrode and a second rotor electrode; the capacitances comprise a first differential capacitance pair comprising a first capacitance formed, during a first portion of the rotation cycle, between a first one of the stator electrodes, and a second one of the stator electrodes, and a second capacitance formed, during a second portion of the rotation cycle, between the second stator electrode, and a third one of the stator electrodes, the first capacitance having a first instantaneous capacitance value $X_1$ and the second capacitance having a second instantaneous capacitance value $X_2$; and the capacitances comprise a second differential capacitance pair comprising a third capacitance formed, during a third portion of the rotation cycle, between a fourth one of the stator electrodes, and a fifth one of the stator electrodes, and a fourth capacitance formed, during a fourth portion of the rotation cycle, between the fifth stator electrode, and a sixth one of the stator electrodes, the third capacitance having a third instantaneous capacitance value $X_3$ and the fourth capacitance having a fourth instantaneous capacitance value $X_4$. The capacitance values $X_1$, $X_2$, $X_3$ and $X_4$ varies depending on the angular positioning of said first and second rotor electrodes.

The proposed new solution enables a more precise measurement of the position and/or the motion of the rotatable element, hence providing a finer resolution, yet without requiring a higher number of rotor and/or stator electrodes of the sensor.

The use of differential capacitance values in determining the angular position further improves the immunity of the capacitive sensor to external influences such as stray capacitances or variations due to changes in humidity or temperature, and thereby to its measurement accuracy. According to a preferred embodiment for the present invention, the rotor electrode is made of two identical parts stretching symmetrically along a diameter on either side around its rotation axis, so that the position is determined with a precision of +/−180 degrees only. As a result, only an incremental sensor is provided for measuring an angular displacement or speed, but no absolute angular position.

According to a variant of the invention, the first and second rotor electrodes and the first, second, third, fourth, fifth and sixth stator electrodes are configured such that the capacitances values of $C_1$, $C_2$, $C_3$ and $C_4$ can be sensed between the first and second, the second and third, the fourth and fifth and the fifth and sixth stator electrodes respectively.

According to another variant of the invention, the capacitive sensor comprises a sensor driver circuit for sensing capacitance values $X_1$, $X_2$, $X_3$ and $X_4$ of capacitances $C1$, $C2$, $C3$, and $C4$, respectively, and for determining the angular position and/or displacement by evaluating a first differential capacitance value $X_{1-2}=X_1-X_2$ and a second differential capacitance value $X_{3-4}=X_3-X_4$.

According to another variant of the invention the first differential capacitance pair and the second differential capacitance pair are arranged such that $X_{1-2}$ varies as a first function of the rotational position of the rotatable element, and $X_{3-4}$ varies as a second function of the rotational position of the rotatable element.

According to another variant of the invention the first and/or second functions are substantially sinusoidal or cosinusoidal, with a period of 180°.

According to another variant of the invention the second function has the same form as the first function, but is phase-shifted with respect to the first function by a phase-shift angle in the rotation cycle.

According to another variant of the invention the phase-shift angle is substantially 45 degrees, +/−90 degrees, which allows to derive the rotational position of the rotatable element with the help of a trigonometric formula.

According to another variant of the invention the first, second and third, and/or the fourth, fifth and sixth stator electrodes are arranged in a common plane orthogonal to the rotation axis of the rotatable element. This allows simplifying the machining process and improving compactness of the provided sensor device.

According to another variant of the invention the first rotor electrode and/or the second rotor electrode is formed in an axial end face of the rotatable element. Preferably the first and second rotor electrodes are formed in a same plane as well, in order to simplify the machining.

According to another variant of the invention the first, second and third, and/or fourth, fifth and sixth stator electrodes are arranged adjacent to a peripheral face of the rotatable element.

According to another variant of the invention the first rotor electrode and/or the second rotor electrode is formed in or on the peripheral face of the rotatable element.

According to another variant of the invention the capacitive sensor comprises a stator element comprising a plurality of angular stator electrode regions arranged about the rotation axis of the rotatable element, wherein the first differential capacitance pair is located in a first one of the angular stator electrode regions and the second differential capacitance pair is located in a second one of the angular stator electrode regions, angularly displaced from the first angular stator electrode region by the phase-shift angle.

According to another variant of the invention the capacitive sensor comprises a rotor element comprising a plurality of angular rotor electrode regions arranged about the rotation axis of the rotatable element, wherein the first rotor electrode comprises a first one of the angular rotor electrode regions, and the second rotor electrode comprises a second one of the angular rotor electrode regions, the first angular rotor electrode region spreading over a larger angular sector than the second angular rotor electrode regions.

According to another variant of the invention the rotatable element is assembled to the distal end of the setting stem of the timepiece.

The invention also aims to provide a sensor calculation unit for a capacitive sensor as described above, the sensor calculation unit being configured to determine the instantaneous angular orientation of the rotatable element comprising two rotor electrodes by:

determining a first differential instantaneous value ($x_{1-2}$) between a first capacitance $C_1$ and a second capacitance $C_2$ and a second differential instantaneous value ($x_{3-4}$) between a third capacitance $C_3$ and a fourth capacitance $C_4$;

using predetermined correspondence information of the first function, identifying a first plurality of plausible values of the first function which correspond to the first differential instantaneous value ($x_{1-2}$);

using predetermined correspondence information of the second function, identifying a second plurality of plausible values of the second function which correspond to the second differential instantaneous value ($x_{3-4}$); and wherein said second plurality of plausible values is a pair of angular values that are separated by 180° and correspond to the angular position of the two rotor electrodes and selecting one angular value amongst this pair of second plurality of plausible values which is the closest to the last previous calculated angular position as being the instantaneous angular position.

The maximal rotational speed determines the maximal time between two measurements. If the initial value is chosen arbitrarily, the position is defined on a range of 180°, which is sufficient for most watch applications, where no absolute angular positioning is required, but only incremental detection. If an absolute position is required, another sensor with one pulse per 360° should preferably be added, or the structure of the rotor electrode pair should be modified in order to be able to discriminate each of them with respect to the other.

BRIEF DESCRIPTION OF THE DRAWINGS

Other features and advantages of the invention will become apparent from the following description of a non-limiting exemplary embodiment, which is described with reference to the appended drawings, in which.

DETAILED DESCRIPTION OF AN EMBODIMENT OF THE INVENTION

An embodiment of the present invention will now be described in detail, with reference to the attached figures. Identical or corresponding functional and structural elements which appear in the different drawings are assigned the same reference numerals.

Figure 1:
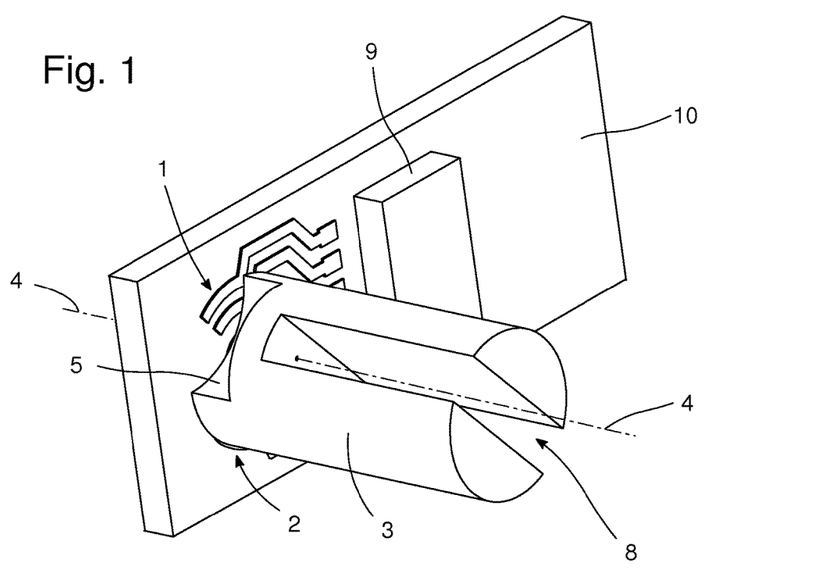
FIG. 1 shows in isometric schematic view an example of a capacitive sensor assembly for a timepiece setting stem according to the present invention.

FIG. 1 shows an example of a rotatable element, such as a pinion shaft or a setting stem which may be found in a timepiece. In the example embodiment described below, a setting stem of a wristwatch will be taken as an illustrative example of an application of the capacitive sensor of the invention. A setting stem may also be known as a crown stem. Note that the setting stem itself is not illustrated in FIG. 1. Rotatable element 3 is rotatable about a rotation axis 4 and is provided with an engagement means (in this example a slot 8) for engaging with a corresponding part of the setting stem. The engagement means in this example is designed to cooperate with the setting stem such that the setting stem can be moved axially along rotation axis 4 without causing any axial motion of the rotatable element 3, but such that any rotational motion of the setting stem is translated into a rotational motion of the rotatable element 3.

The rotatable element 3 shown in FIG. 1 is provided at its distal end with one or more rotor electrodes 5. In this example there are two rotor electrodes arranged diametrically opposite each other with respect to the rotational axis 4. The rotor electrodes 5 are substantially planar and are arranged to face a number of stator electrodes which are similarly planar, in the same plane as the rotor electrodes, and separated from the rotor electrodes by a thin dielectric, which may be an air gap or a piece of solid dielectric material such as a plastic film, for example. The stator electrodes may advantageously be formed as tracks on a printed circuit board (PCB) 10, for example, and they are arranged to form two differential capacitance pairs indicated by arrows 1 and 2, for reasons which will be described later. The PCB 10 may also carry sensor driver circuitry 9 for providing an electrical interface to the differential capacitance pairs 1 and 2.

In the case of a wristwatch, the dimensions of the various elements shown in FIG. 1 would be tiny. For example, the rotatable element 3 may be 1 mm or less in diameter and the PCB 10 may have an area of five or six square millimeters or less.

Figure 2:
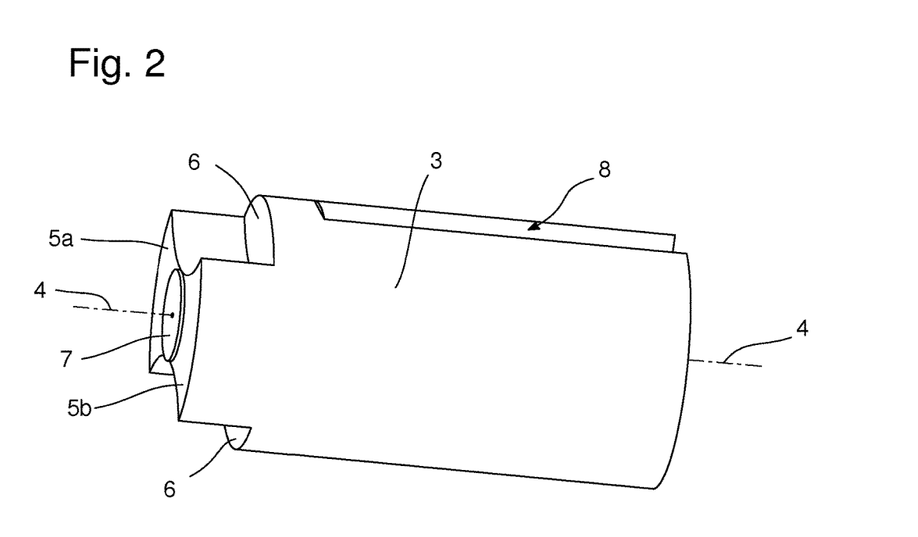
FIG. 2 shows in isometric schematic view the rotor electrode arrangement used in the example capacitive sensor assembly depicted in FIG. 1.

FIG. 2 shows a different view of the rotatable element 3 illustrated in FIG. 1. This view shows the shape of the two electrodes 5a and 5b, which may be formed by milling two shoulders 6 into the peripheral surface at the distal end of the rotatable element 3. The end face of the rotatable element 3 may also comprise a spacer element 7 for providing a physical contact with, and thereby maintaining a constant spacing from, the PCB 10. Such a rotatable element 3, with the slot 8, the spacer element 7 and the shoulders 6 may be easily fabricated from metal, using standard machine-tool techniques, even when its dimensions are small. The spacer element 7 has a thickness that is typically comprised, for a rotatable element 3 meant for the setting stem of a wristwatch, within 0.05 mm and 0.15 mm, and allows to provide a greater shock robustness.

Figure 3:
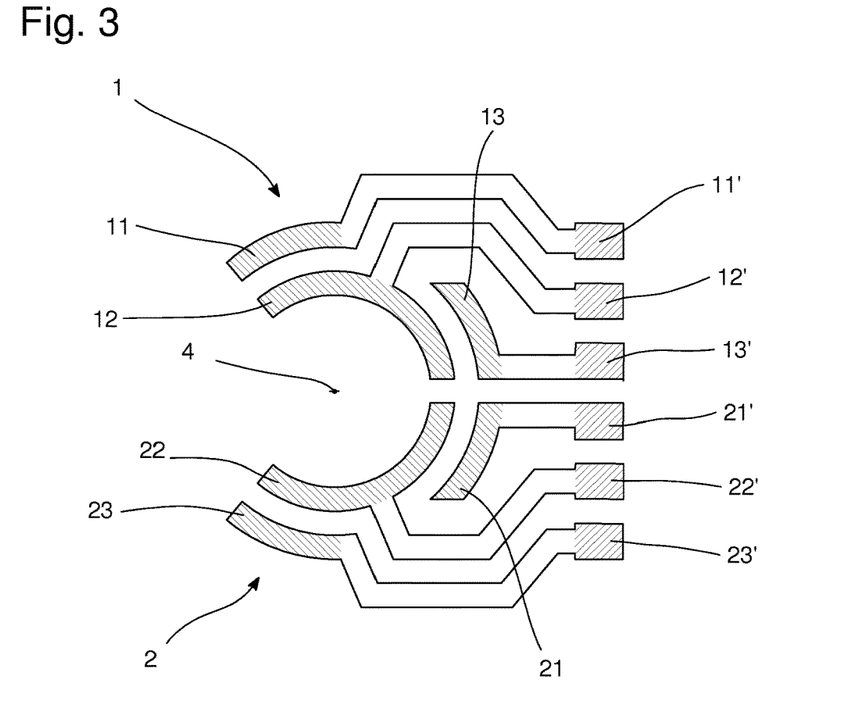
FIG. 3 shows in schematic plan view the stator electrode arrangement used in the example capacitive sensor assembly depicted in FIG. 1.

FIG. 3 shows how the stator electrodes may be arranged to form, in capacitive proximity to the rotor electrodes two differential capacitance pairs 1 and 2. Six stator electrode regions 11, 12, 13, 21, 22 and 23 are illustrated in FIG. 3 (regions shaded with left-diagonal hatching) which in this example are each formed as part of a metal track of the PCB 10. Each of the metal tracks also comprises a connector pad 11', 12', 13', 21', 22', 23' (shaded with right-diagonal hatching) for connecting each of the respective stator electrodes 11, 12, 13, 21, 22 and 23 to sensor driver circuitry 9. The stator electrodes 11, 12, 13, 21, 22 and 23 are formed as concentric arc segments centered on the axis of rotation 4 of the rotatable element 3, in order to allow a modeling of the capacitance values as a sine or cosine functions depending of the angular position of the rotatable element 3, on which are arranged rotor electrodes, as explained hereafter further in view of FIGS. 5-7. This is simply one example of a configuration of the stator electrodes which can be used to carry out the invention. Other configurations are possible for the stator and rotor electrodes, that may be arranged around the periphery of the rotatable element 3 instead of (or as well as) orthogonal to the rotational axis 4, as in the illustrated example. FIGS. 8-11 show an alternative embodiment for the present invention with a rotatable element 3 split into two pieces, and stator electrodes arranged on a flexible substrate rolled around its periphery, as explained hereafter.

Figure 4:
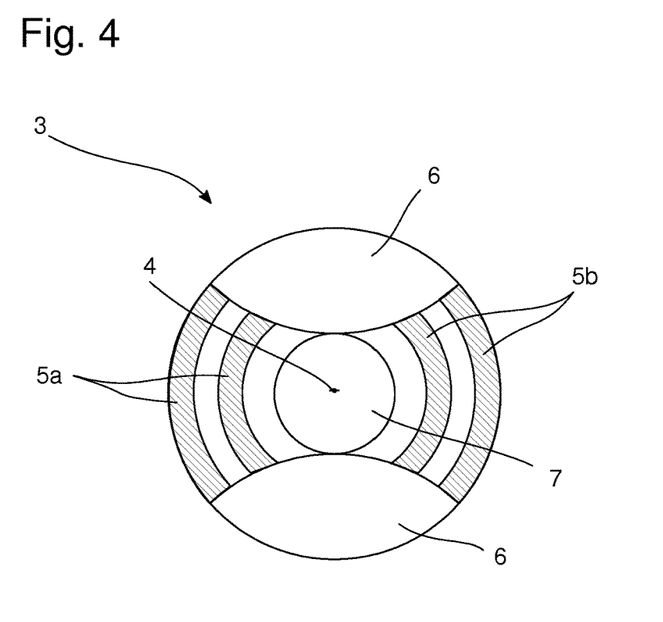
FIG. 4 shows an end-on view of the rotor electrodes used in the example capacitive sensor assembly depicted in FIG. 1.

In the example shown in FIG. 3, the first differential capacitance pair 1 comprises first, second and third stator electrode regions 11, 12 and 13 (shaded with left-diagonal hatching), while the second differential capacitance pair 2 comprises fourth, fifth and sixth stator electrode regions 21, 22 and 23, similarly shaded. When a rotor electrode is in close capacitive proximity facing two of the stator electrodes, for example the first and second stator electrodes 11 and 12, forming a first pair of stator electrodes, a capacitance is created between stator electrodes 11 and 12 via the rotor electrode. FIG. 4 shows an example of a rotor electrode arrangement which is designed to face the stator electrodes depicted in FIG. 3, and thereby create varying capacitances between pairs of the stator electrodes as the rotatable element 3 rotates. Rotor electrode regions 5a and 5b are shaded to indicate which regions of the axial end-face of rotational element 3 are brought into capacitive proximity with the stator electrodes 11, 12, 13, 21, 22 and 23, which respectively form a first pair of stator electrodes between the first 11 and second 12 stator electrodes, a second pair of stator electrodes between the second and third stator electrodes, a third pair of stator electrodes between the fourth 21 and fifth 22 stator electrode, and a fourth pair of stator electrodes between the fifth 22 and sixth 23 stator electrodes. These rotor electrode regions 5a and 5b are notional regions, and do not necessarily differ from the material of the surrounding rotatable element 3. The rotatable element 3 may be machined or otherwise fabricated from a single contiguous piece of metal or other conductive material, for example.

In the illustrated example, the rotor electrodes 5a and 5b are preferably electrically connected to the ground potential that is the same as the metallic watchcase or movement plate. As a result, there is no need to put an isolation between the watchcase and the rotational element, which is advantageous since such an isolation would be difficult to realize in a small volume. In this case, rotor electrodes 5a and 5b play a passive role in the capacitances, such that the capacitances can be measured at the connections 11', 12', 13', 21', 22', 23' to the stator electrodes 11, 12, 13, 21, 22 and 23.

Figure 5:
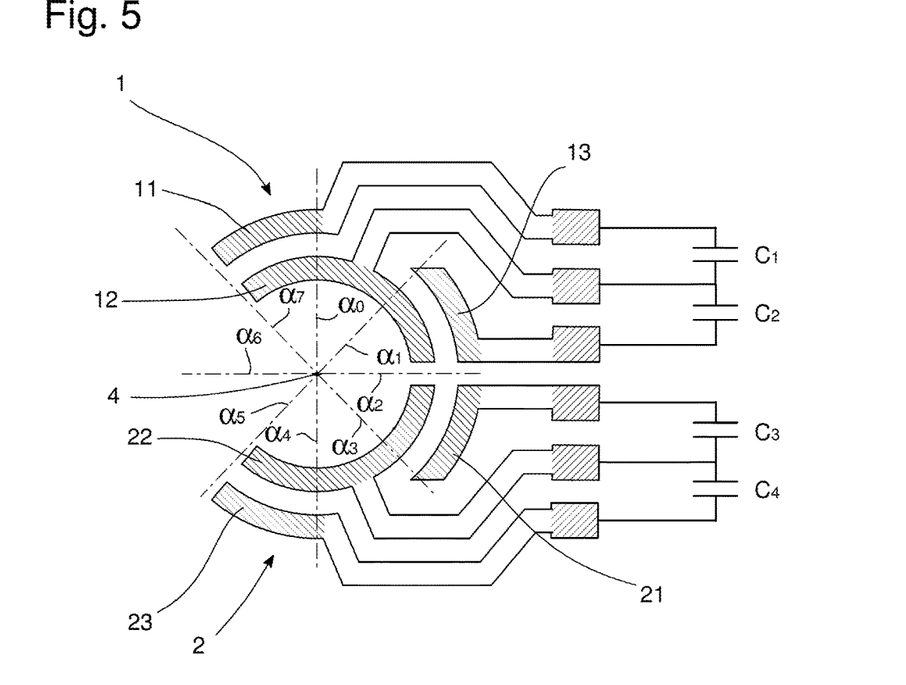
FIG. 5 five illustrates angles and capacitances of the example capacitive sensor assembly of FIG. 1 with reference to the stator electrodes.
Figure 6:
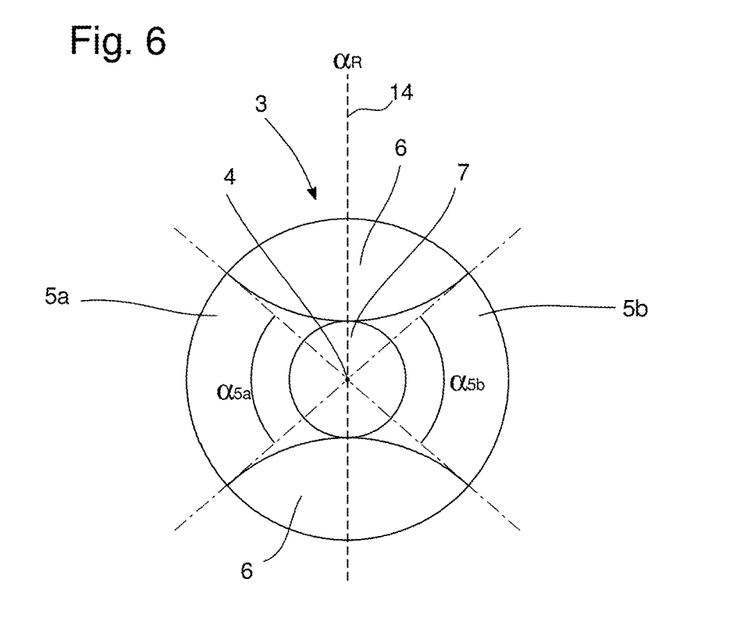
FIG. 6 shows angles relating to the rotor electrodes used in the example capacitive sensor assembly depicted in FIG. 1.

FIGS. 5 and 6 show the same arrangements of stator and rotor electrodes as in FIGS. 3 and 4, but with angles and capacitances schematically indicated. $X_1$ represents the instantaneous value of the capacitance $C_1$ measurable between the first and second stator electrodes 11 and 12. $X_1$ has a maximum value (which will be referred to as zero for the sake of simplicity) when neither of the rotor electrodes 5a and 5b covers the first stator electrode 11 (i.e. no part of the angular sector $\alpha_{5a}$ or $\alpha_{5b}$ falls between $\alpha_7$ and $\alpha_0$), and a minimum value when either of the rotor electrodes 5a and 5b is fully covering the first stator electrode 11 (i.e. when angular sector $\alpha_{5a}$ or $\alpha_{5b}$ fully includes the angle between $\alpha_7$ and $\alpha_0$), i.e. when the dielectric between the two stator electrodes, whose isolation properties are influenced by the rotor, is minimal. $X_1$ has an intermediate value when either of the rotor electrodes 5a or 5b is partially covering the first stator electrode 11 (i.e. when angular sector $\alpha_{5a}$ or $\alpha_{5b}$ partially coincides with angle between $\alpha_7$ and $\alpha_0$). The angular positions $\alpha_0$, $\alpha_1$, $\alpha_2$, $\alpha_3$, $\alpha_4$, $\alpha_5$, $\alpha_6$ and $\alpha_7$ each indicate a delimitation (i.e. a beginning or an end, relative to the rotation of the rotatable element 3) of the stator electrodes 11, 12, 13, 21, 22 and 23, and may be evenly distributed about the rotational axis 4, defining hence 8 angular sectors of 45 degrees each. The angular sectors $\alpha_{5a}$ and $\alpha_{5b}$ of each of the rotor electrodes 5a and 5b may advantageously be arranged to extend angularly across two neighbouring segments delimited by the angular positions $\alpha_0$, $\alpha_1$, $\alpha_2$, $\alpha_3$, $\alpha_4$, $\alpha_5$, $\alpha_6$ and $\alpha_7$, i.e. in this case around 90 degrees. During clockwise rotation (clockwise with respect to the stator electrodes in FIGS. 3 and 5) of the rotatable element 3, each rotor electrode 5a and 5b creates a substantially uninterrupted variation of finite capacitance values $X_1$, $X_2$, $X_3$ and $X_4$ for each capacitance $C_1$, $C_2$, $C_3$ and $C_4$ as the respective rotor electrode 5a or 5b sweeps past the successive stator electrode pairs 11 and 12 (i.e. the first pair) 12 and 13 (i.e. the second pair); 21 and 22 (i.e. the third pair); and eventually 22 and 23, i.e. the fourth pair. Reference number 14 in FIG. 6 indicates a centreline that is in the middle of the two rotor electrodes 5a and 5b, which will be used as a reference when describing how the values of C1, C2, C3 and C4 vary during the rotation of the rotatable element 3. This centreline 14 is the one helping define the instantaneous angular position $\alpha_R$ of the rotatable element 3.

Figure 7:
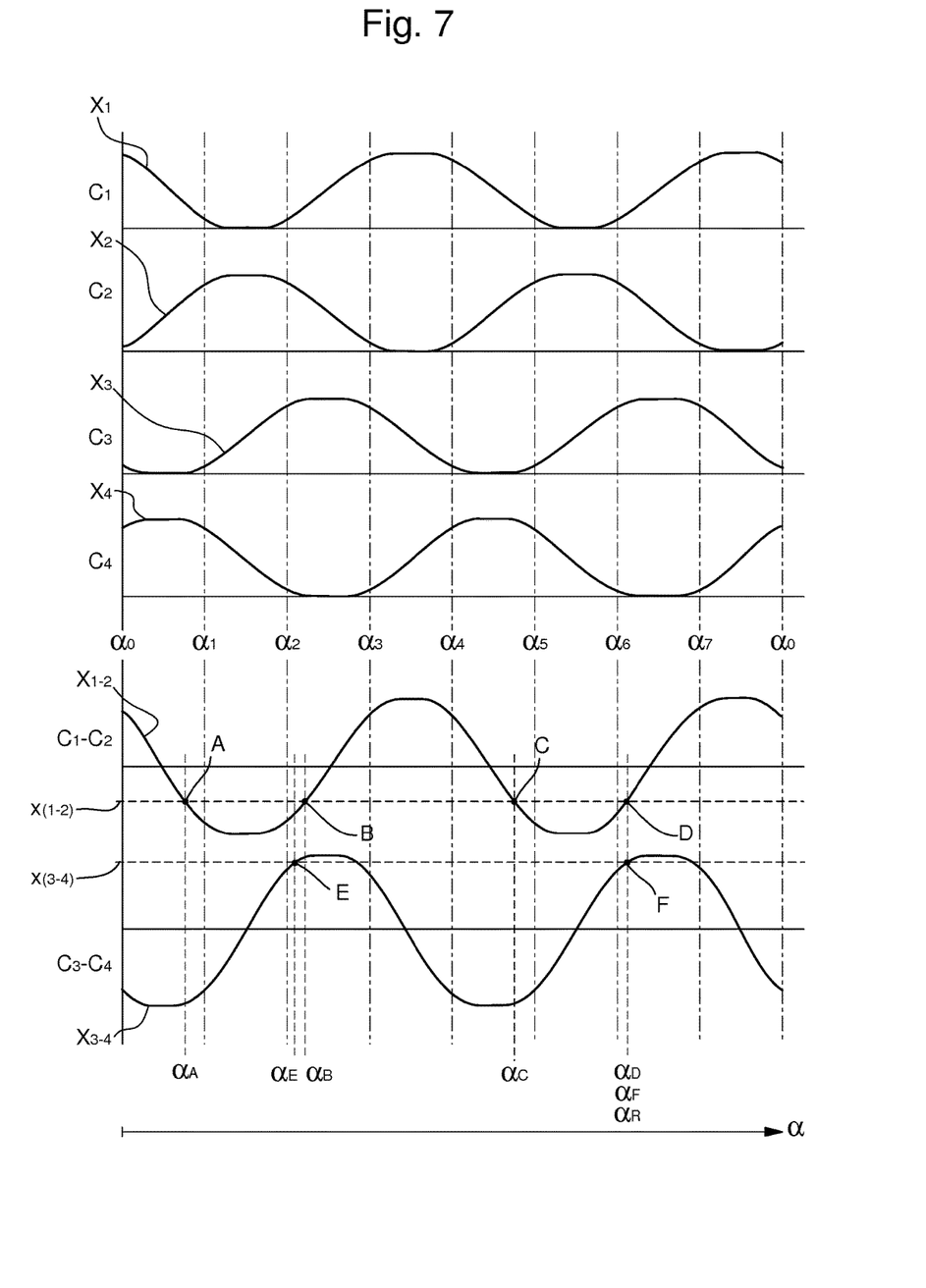
FIG. 7 shows graphically how the difference values of the two differential capacitance pairs in the example capacitive sensor of FIG. 1 vary during a rotation cycle.

FIG. 7 illustrates how each of the capacitance values $X_1$, $X_2$, $X_3$ and $X_4$ may vary with angular position $\alpha$ of the rotatable element 3 during such a clockwise rotation as the centreline 14 of the rotatable element 3 sweeps past angular positions $\alpha_0$, $\alpha_1$, $\alpha_2$, $\alpha_3$, $\alpha_4$, $\alpha_5$, $\alpha_6$ and $\alpha_7$ in succession. FIG. 7 also shows how difference values $X_1-X_2$ and $X_3-X_4$ vary during the same clockwise rotation of the rotatable element 3 through angular positions $\alpha_0$, $\alpha_1$, $\alpha_2$, $\alpha_3$, $\alpha_4$, $\alpha_5$, $\alpha_6$ and $\alpha_7$. FIG. 7 also illustrates an example of how the angular position of the rotatable element 3 may be deduced from the instantaneous difference values $X_1-X_2$ between capacitances $C_1$ and $C_2$ and $X_3-X_4$ between capacitances $C_3$ and $C_4$. In the illustrated example, the instantaneous measured values of $X_1-X_2$ and $X_3-X_4$ are $x_{1-2}$ and $x_{3-4}$ respectively. The quantity $X_1-X_2$ varies with angular position $\alpha$ according to a first function, and the quantity $X_3-X_4$ varies with angular position $\alpha$ according to a second function. The stator and rotor electrodes may be arranged such that the second function is similar to the first function, but phase-shifted by a predetermined phase-shift angle. In the illustrated example of the previous FIGS. 1-6, the phase-shift angle is selected to be substantially 135 degrees, as it can be observed when comparing the values of $X_1-X_2$ with the ones of $X_3-X_4$ on FIG. 7. Indeed, when considering that all angles $\alpha_1$, $\alpha_2$, $\alpha_3$, $\alpha_4$, $\alpha_5$, $\alpha_6$ and $\alpha_7$ are multiples of 45 degrees, it can be appreciated that the following equation is fulfilled:

$$X_1-X_2(\alpha)=X_3-X_4(\alpha+135).$$

The stator and rotor electrodes may be arranged such that the first and second functions can be approximated to sine or cosine functions, as according to the preferred embodiment illustrated on FIGS. 1-6. In this case, assuming a function $X_3-X_4(\alpha)=\cos(2\alpha)$, yields, in view of the previous equation:

$$X_1-X_2(2\alpha)=\cos [2(\alpha+135)]=\cos [2\alpha+270]=\cos [2\alpha-90]=\sin (2\alpha) \text{ and hence:}$$

$$X_1-X_2/X_3-X_4=\tan(2\alpha),$$

which allows to derive the instantaneous angular position $\alpha$ of the rotatable element 3 according to the formula:

$$\alpha=\text{Arc tan}(X_{1-2}/X_{3-4})/2,$$

wherein alpha ($\alpha$) is a value comprised between +/−90°.

In view of the above formulas and equations, will be understood that a second possible absolute value for $\alpha$ is $\alpha+/-180°$, which means that the sensor cannot discriminate between two symmetrical positions of the rotor electrodes wherein the position of two rotor electrodes 5a and 5b are inverted.

Actually instead of a phase shift of 135 degrees, any phase shift of 45 degrees plus or minus 90 degrees could be applied without significantly changing the contents of the trigonometric formula. Indeed, it can be appreciated that applying a phase shift of 45 degrees instead of 135 merely changes the sign of the function $X_3-X_4(\alpha)$, since $$\cos [2(\alpha+45)]=\cos [2\alpha+90]=-\sin(2\alpha)$$

Other mathematical functions may be used to determine the angular position $\alpha$ from the measured values $X_{1-2}$ and $X_{3-4}$ with other configurations of the stator and rotor elements, yet with less calculation simplicity. It can be appreciated though that according to the preferred embodiment described above, the angular resolution of the sensor is in any case far better than the one of each angular sector (i.e. 45 degrees) of the stator electrode.

Alternatively, when the first and second functions cannot be approximated by sine of cosine functions, e.g. in order to simplify the fabrication of the rotor electrode, the value of the angular position $\alpha$ may be related to the values $X_{1-2}$ and $X_{3-4}$ by a look-up table of correspondence data or other source of correspondence information, as explained hereafter further in view of the bottom of FIG. 7. The form of the first and second functions more generally depends on the shape of the rotor electrode (e.g. angular sector values $\alpha_{5a}$ or $\alpha_{5b}$) and on the size of stator electrode (e.g. when considering $\alpha_0$ and $\alpha_7$ as border angular positions and also depending its radius). As it can be appreciated in view of the $X_1-X_2$ graph, there are four possible values $\alpha_A$, $\alpha_B$, $\alpha_C$ and $\alpha_D$ of the angular position $\alpha$ of the rotatable element 3 for the given measured value $x_{1-2}$ of the first differential capacitance pair 1 at a given instant time. Of these, only angular positions $\alpha_B$ and $\alpha_D$ correspond to values $\alpha_E$ and $\alpha_F$ of $X_3-X_4$ (at points E and F) which are plausible in view of the value $x_{3-4}$ of $X_3-X_4$, of the second differential capacitance pair 2, for a measurement carried out at the same instant time as the one for value $x_{1-2}$.

This allows deriving an actual angular position pair $\alpha_E$ and $\alpha_F$, depending on the angular position of the two symmetrically arranged rotor electrodes 5a and 5b. The two angles $\alpha_E$ and $\alpha_F$ of this pair are separated by 180 degrees because they actually correspond to the two possible angles stretching along the centreline 14 illustrated on FIG. 6 between the each electrode 5a and 5b. On the bottom of FIG. 7 it can be appreciated that there is a slight shift between $\alpha_B$ and $\alpha_E$, whereas $\alpha_D$ and $\alpha_F$ are quite identical. This merely shows that the modeling is imperfect as compared to a sine/cosine function, but yet does not help discriminate between these two possible values to determine the actual instantaneous angular position $\alpha_R$ of the rotatable element.

Due to the symmetrical arrangement of the rotor electrodes 5a, 5b and when the sensor is used for incremental detection purposes, a first instantaneous angular position $\alpha_R$ can be arbitrarily chosen between the two possible values of the actual angular position pair $\alpha_E$ and $\alpha_F$. Yet once this first angular position has been set, the instantaneous angular position $\alpha_R$ will be preferably recursively defined by choosing, between the two possible angular values of angular position pair $\alpha_E$ and $\alpha_F$, the one of the two values that is the closest to the last calculated instantaneous angular position $\alpha_R$. This corresponds, from both an empirical and statistical point of view, to the likeliest position in view of the last measured one. On FIG. 7, this sought angle position turns out to correspond to $\alpha_F$.

The angular displacement can then easily be calculated by computing the difference between the instantaneous angular position $\alpha_R$ and the last calculated instantaneous angular position, which yields an angle comprised within −90° and 90°, as long as the angular speed remains under an upper limit set by the system. This limit can depend, among others, on the frequency of the measurements. The direction of the rotation is then simply indicated by the sign of this differential angle.

The maximal allowed rotational speed determines the maximal time between two measurements. This measurement rate is directly proportional to the number of rotor electrodes. With an ideal absolute sensor, the measurement rate can be half of the value of the presented variant with 2 rotor electrodes. The goal is to measure an angular displacement that could be several rounds (>>360°) during a time interval. The rotation speed and direction can be easily calculated from the angular displacement.

With standard digital incremental sensor, the number of rotor electrodes, such as teeth, should be much higher than two, as in the frame of the presented solution, in order to have the same resolution. Because of the small available volume, it isn't possible to realize such small teeth. As a result, the incremental sensor provided allows solving this technical problem in significantly increasing the angular resolution, without simultaneously requiring an increase of the number of rotor electrodes.

It will be understood, however, that the preferred calculation method described above is merely one the possible methods which may be used to deduce the actual angular position from measured values of the capacitances. The calculation may be carried out by suitable circuitry and/or software in sensor driver circuitry 9 on the PCB 10, or by a separate processor unit. The example configuration described above, comprising two rotor electrodes and two differential capacitance pairs, is also merely one of the possible configurations for carrying out the invention. Other numbers of rotor and/or static electrodes, and/or other relative angles between the electrodes may be used.

The following FIGS. 8-11 described hereafter show an alternative embodiment for the present invention in which the stator electrodes are not arranged on the very same plane of a PCB 10 anymore, but on a flexible substrate 100 wrapped around the rotatable element 3, that is here shown mounted at the extremity of a timepiece stem 30. The rotatable element 3 is itself split into two distinct sub-pieces, i.e. a first sub-rotor 31 and a second sub-rotor 32 which are spaced apart by a slit 80 in which a fixed element (not shown) can be lodged in order to allow for a precise axial positioning along the rotation axis 4.

Figure 9:
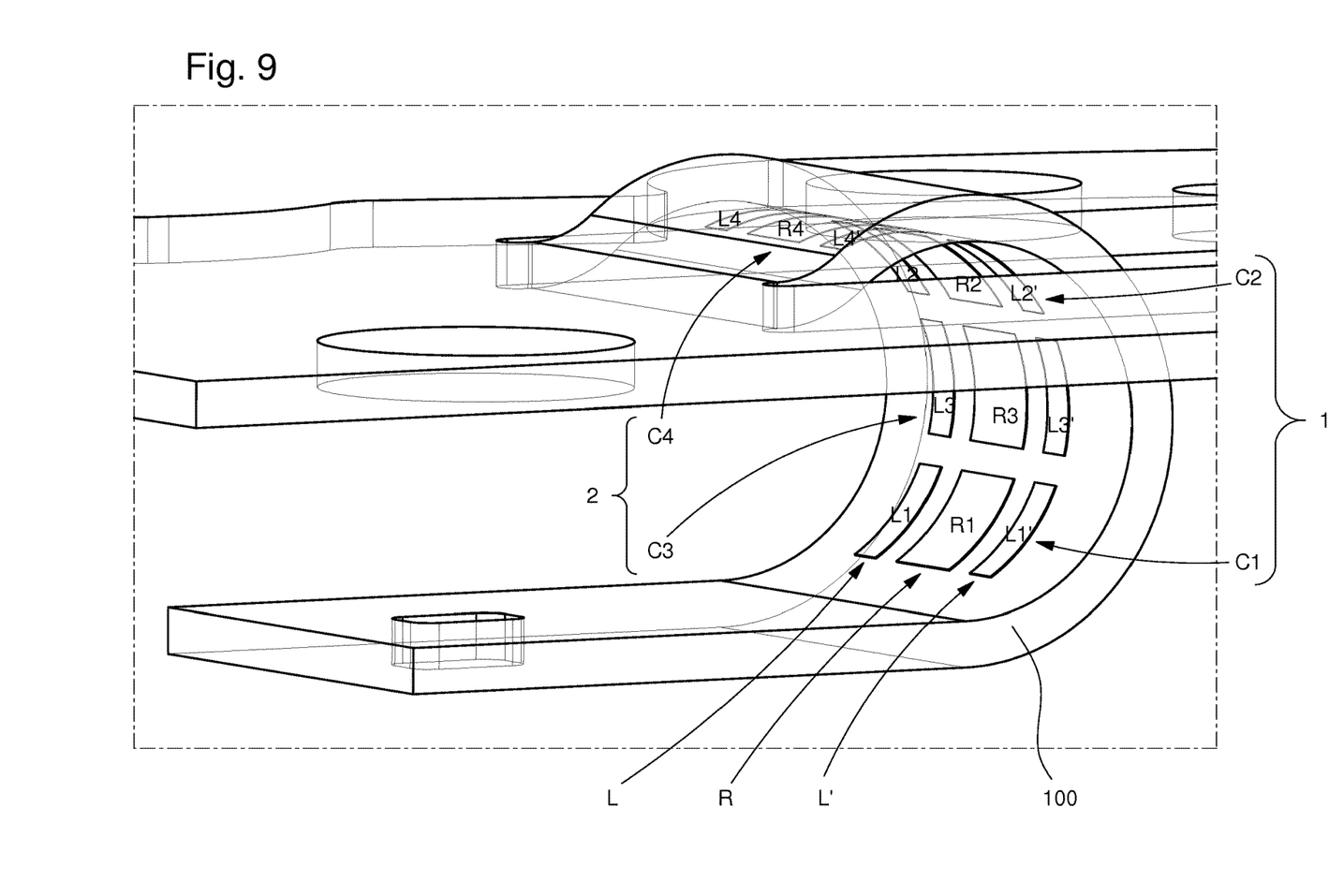
FIG. 9 shows a detailed perspective view of the series of capacitances mounted in parallel of the stator electrodes of FIG. 8.
Figure 10:
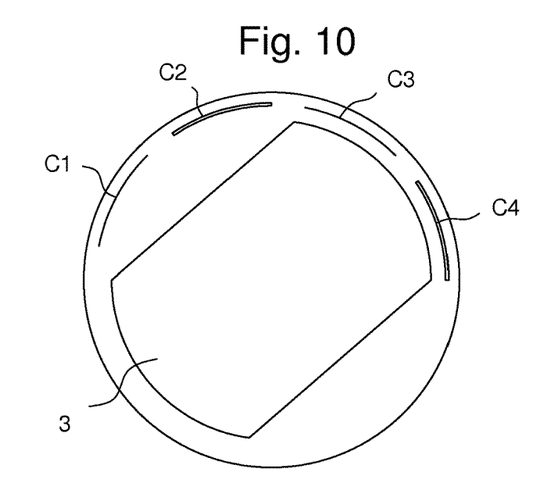
FIG. 10 shows a section view of rotor and stator electrodes in a plane perpendicular to the rotation axis of the rotatable element of FIG. 8.
Figure 11:
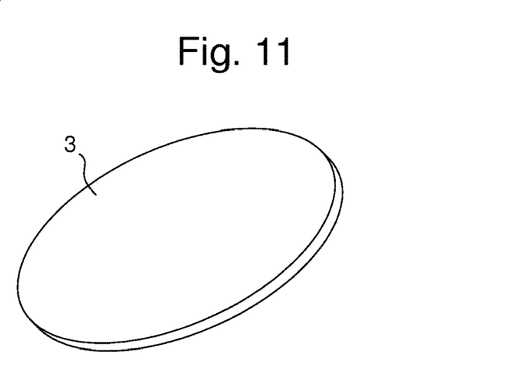
FIG. 11 shows an alternative form for a rotatable element, applicable to the present invention.

As it can be appreciated in view of FIG. 9, the stator electrodes are arranged according to an array pattern in which shows:
A central row R comprising 4 thick electrodes R1, R2, R3 and R4, and
Two lateral rows, i.e. a first lateral row L and a second lateral row L', comprising 4 thinner electrodes each (i.e. L1, L2, L3, L4 and L1', L2', L3', and L4', respectively).

Figure 8:
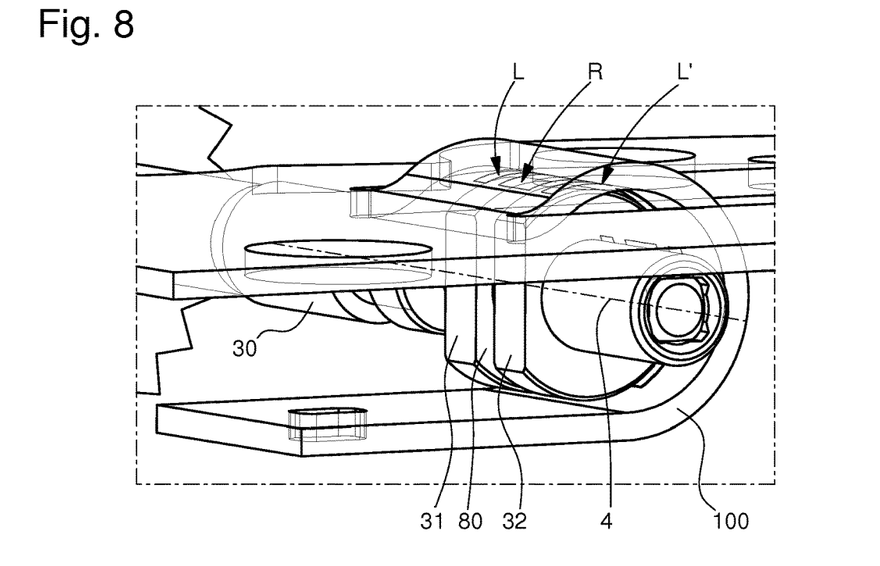
FIG. 8 shows a perspective view of an alternative embodiment for the capacitive sensor assembly according to the present invention, wherein stator electrodes are arranged on a flexible substrate wrapped around a rotatable element.

As it can be appreciated in view of FIG. 8, the first sub-rotor 31 is disposed so as to fill in the gap between the first lateral row L of stator electrodes and the central row R of electrodes, while the second sub-rotor 32 is disposed so as to fill in the gap between the second lateral row L' of stator electrodes and the central electrodes R. Hence the capacitance values between the first electrode of the first lateral row L1 and the first central electrode R1, forming a first pair of stator electrodes, are modified depending on the angular position of the first sub-rotor 31 over its rotation cycle, whereas simultaneously the capacitance values between the first electrode of the second lateral row L1' and the first central electrode R1, forming another first pair of stator electrodes, are modified depending on the angular position of the second sub-rotor 32 over its rotation cycle. The same applies to every second, third, and fourth pairs of electrodes which are formed by stator electrodes L2-R2 and L2'-R2, L3-R3 and L3'-R3, L4-R4 and L4'-R4, respectively. The fact that two rotatable elements are available instead of a single one, as in the previous embodiment of FIGS. 1-5, also allows to double the capacitance values X1, X2, X3, X4 of each capacitances C1, C2, C3, and C4 formed between the two series of stator electrodes, because having two lateral rows L, L' on either side of the central row R allows to have, e.g. with a cabling pattern starting from the central row R, two capacities branched in parallel.

As shown on FIG. 9, showing a section view in either of the plane of the first sub-rotor 31 or the second sub-rotor 32, the functioning principle of this alternative embodiment for yielding angular values is otherwise quite similar to the one of the previous preferred embodiment illustrated by FIGS. 1-5, because the angular shift between the first capacitance C1 and the second capacitance C2 is still 90 degrees, whereas the angular shift between the first and third capacitance C3 is now just 45 degrees, instead of 135 degrees on FIG. 5, which merely influences the sign of the function when a sinusoidal modeling is applicable for deriving the actual angular position of the rotor, as explained earlier. Still a first differential capacitance pair 1 formed by the first and second capacitance C1 and C2, as well as a second differential capacitance pair 2, formed by the third and fourth capacitance, respectively, allows to derive the angular position of the rotatable element 3. These differential capacitance pairs are now only made of interlocked capacitances as compared to the previous embodiment of FIG. 5.

The geometric shape of the rotatable element 3, determining the wave form of the output signals of the capacitance values, is preferably chosen to cover approximately two adjacent angular sectors—here corresponding to the stator electrodes of capacitances C2, C4 spreading over 45 degrees each and leave the two others—here capacitances C1, C3—uncovered. However, as a variant embodiment shown on FIG. 10, an elliptic shape could also be considered without too much prejudice to the sinusoidal modeling of the capacitance values. Calculation based on look-up of correspondence data in tables will in any case still be available, and therefore choosing a shape easy to manufacture such as the one of FIG. 10 could be privileged for mass production purposes.

The invention claimed is:
1. A capacitive sensor for determining an instantaneous angular position of a rotatable element of a timepiece, the capacitive sensor comprising:
six stator electrodes formed as concentric arcs segments centered on the axis of rotation of the rotatable element, the first, third, fourth and sixth stator electrodes extending along 45°, and the second and fifth stator electrodes extending along 135°, the first and second, respectively the second and third, the fourth and fifth, and the fifth and sixth stator electrodes, extending along a common 45-degree angular portion, the four 45-degree angular portions being distinct;
one rotor electrode configured to rotate with the rotatable element, the rotor electrode being made of two identical parts extending symmetrically on either side of its rotation axis along 90°;
the rotor electrode and the stator electrodes configured to, during a rotation cycle of the rotatable element, provide capacitances between two of the six stator electrodes, such that each of the capacitances varies over at least a portion of the rotation cycle due to the influence of the rotor electrode;

the capacitances comprising a first differential capacitance pair comprising a first capacitance formed between the first and second stator electrodes, and a second capacitance formed between the second and third of stator electrodes, the first capacitance having an instantaneous first capacitance value $X_1$ and the second capacitance having an instantaneous second capacitance value $X_2$ depending on the angular positioning of the rotor electrode;

the capacitances comprising a second differential capacitance pair comprising a third capacitance formed between the fourth and fifth stator electrodes, and a fourth capacitance formed between the fifth and sixth stator electrodes, the third capacitance having an instantaneous third capacitance value $X_3$ and the fourth capacitance having an instantaneous fourth capacitance value $X_4$ depending on the angular positioning of the rotor electrode;

the capacitive sensor comprising a sensor driver circuit for sensing capacitance values $X_1$, $X_2$, $X_3$ and $X_4$, and for determining the instantaneous angular position by evaluating a first differential capacitance value $X_{1-2}=X_1-X_2$ and a second differential capacitance value $X_{3-4}=X_3-X_4$.

2. The capacitive sensor according to claim 1, wherein the first differential capacitance pair and the second differential capacitance pair are configured such that the first differential capacitance value $X_{1-2}$ varies as a first function of the instantaneous angular position of the rotatable element, and the second differential capacitance value $X_{3-4}$ varies as a second function of the instantaneous angular position of the rotatable element.

3. The capacitive sensor according to claim 2, wherein the first and/or second functions are substantially sinusoidal or cosinusoidal with a period of 180°.

4. The capacitive sensor according to claim 2, wherein the second function has substantially a same form as the first function, and is phase-shifted with respect to the first function by a phase-shift angle in the rotation cycle.

5. The capacitive sensor according to claim 4, wherein the phase-shift angle is substantially 135 degrees or 45 degrees.

6. The capacitive sensor according to claim 1, wherein the first, second and third, and/or the fourth, fifth and sixth stator electrodes are arranged in a common plane orthogonal to the rotation axis of the rotatable element.

7. The capacitive sensor according to claim 1, wherein a first rotor electrode part and/or a second rotor electrode part is formed in an axial end face of the rotatable element.

8. The capacitive sensor according to claim 1, wherein the first, second and third, and/or fourth, fifth and sixth stator electrodes are arranged adjacent to a peripheral face of the rotatable element.

9. The capacitive sensor according to claim 8, wherein a first rotor electrode part and/or a second rotor electrode part is formed in or on the peripheral face of the rotatable element.

10. The capacitive sensor according to claim 4, further comprising a stator element comprising a plurality of angular stator electrode regions arranged about the rotation axis of the rotatable element, wherein the first differential capacitance pair is located in a first one of the angular stator electrode regions and the second differential capacitance pair is located in a second one of the angular stator electrode regions, angularly displaced from the first angular stator electrode region by the phase-shift angle.

11. The capacitive sensor according to claim 1, wherein the rotatable element is arranged to be mounted to a setting stem of the timepiece.

12. A sensor calculation unit for a capacitive sensor according to claim 2, the sensor calculation unit configured to determine the instantaneous angular position of the rotatable element by:

determining a first differential instantaneous value of the first differential capacitance value $X_{1-2}=\mathbf{X1}-\mathbf{X2}$ between the first capacitance and the second capacitance, and a second differential instantaneous value of the second differential capacitance value $X_{3-4}=\mathbf{X3}-\mathbf{X4}$ between the third capacitance and the fourth capacitance;

using predetermined correspondence information of the first function, identifying a first plurality of plausible values of the first function which correspond to the first differential instantaneous value;

using predetermined correspondence information of the second function, identifying a second plurality of plausible values of the second function which correspond to the second instantaneous value, wherein the second plurality of plausible values is a pair of angular values that are separated by 180° depending on the angular position of the two rotor electrodes; and selecting one angular value amongst this pair of second plurality of plausible values which is the closest to the last previous calculated angular position as being the instantaneous angular position.

\* \* \* \* \*